United States Patent
Kearns et al.

(10) Patent No.: US 7,323,363 B1
(45) Date of Patent: Jan. 29, 2008

(54) CONTACT LOAD PROFILE MODIFICATION FOR A COMPRESSION SOCKETED CPU

(75) Inventors: Donald A. Kearns, San Diego, CA (US); George C. Zacharisen, Santa Clara, CA (US); David K. McElfresh, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 155 days.

(21) Appl. No.: 10/770,192

(22) Filed: Feb. 2, 2004

(51) Int. Cl.
*H01L 21/00* (2006.01)

(52) U.S. Cl. ............... 438/109; 438/121; 257/686; 257/726; 257/727; 257/785

(58) Field of Classification Search ........ 257/686–687, 257/690, 706, 717–719, 713, 701, 723, 726–727, 257/731, 785, 709, 711, E25.006, E25.013, 257/E25.018, E23.085, E23.086; 438/109–110, 438/117, 121, 125; 361/735, 790, 709, 713
See application file for complete search history.

(56) References Cited

U.S. PATENT DOCUMENTS

| 6,297,960 B1 * | 10/2001 | Moden et al. ............... 361/719 |
| 2003/0132529 A1 * | 7/2003 | Yeo et al. .................... 257/778 |
| 2005/0117305 A1 * | 6/2005 | Ulen et al. .................. 361/719 |

* cited by examiner

*Primary Examiner*—Mary Wilczewski
*Assistant Examiner*—Thanh Y. Tran
(74) *Attorney, Agent, or Firm*—Osha•Liang LLP

(57) ABSTRACT

A integrated circuit housing includes a first clamping hardware, a second clamping hardware operatively connected to the first clamping hardware, and an integrated circuit stack comprising a top portion and a bottom portion, wherein the first clamping hardware contacts the top portion and the second clamping hardware contacts the bottom portion, and wherein a first shim is interposed between the bottom portion and the second clamping hardware.

7 Claims, 6 Drawing Sheets

CONTACT LOAD PROFILE MODIFICATION FOR A COMPRESSION SOCKETED CPU

BACKGROUND

The central processing unit (CPU) is an integrated circuit (IC), and is one of many integrated circuits included in electronic devices, such as modern computers (not shown). CPUs may perform operations on data and transmit the results to other integrated circuits. Therefore, the CPU's function is vital to the overall performance of a computer. The structure that surrounds the CPU within the computer also plays a key role in aiding and protecting the CPU in a computer.

FIG. 1 shows an integrated circuit housing, which includes typical components that surround the CPU in a computer or other electronic device. In the center of the figure, an IC, i.e., a chip (6), operates on top of a ceramic land grid array (CLGA) package (8). The CLGA package (8) contains small shaped metal pads (not shown) that connect to internal wires leading up to the chip (6). A socket (10) is an electrical interconnect that locates both the chip (6) and the CLGA package (8). The socket (10) allows the chip (6) to electrically interface with a printed circuit board (PCB) substrate (12) through the CLGA package (8). The PCB substrate (12) also contains metal pads (not shown) on the surface that correspond to the metal pads on the CLGA package (8) beneath the chip (6). Each individual connection that is made between the PCB substrate (12) and the CLGA package (8) components is called a contact (14). All of the aforementioned internal components surrounding the chip (6) may be collectively referred to as a stack.

Continuing with FIG. 1, the stack is typically surrounded by clamping hardware. Typical clamping hardware may include a heat dissipater (2) (e.g., a heat sink), a bolster plate (18), and typically as many as four fasteners (4). The heat dissipater (2) may be affixed to the bolster plate (18) via four fasteners (4) that fasten through the PCB substrate (one on each corner of the bolster plate). The bolster plate (18) is typically a rigid and stiff element. In between the bolster plate (18) and the backside of the PCB (12) is a thin insulator (16) made of plastic type material, which is typically included for its electrical properties.

When the fasteners (4) are tightened, the clamping hardware imparts a load on the contacts (14) between the chip (6) and the PCB substrate (12). Due to the large number of contacts per circuit board and the force required for electrical function of each contact (14), the load applied by the clamping hardware may be quite large. For example, a typical 37 by 37 PCB substrate (12) includes approximately 1,368 contacts. The finite stiffness of the clamping hardware does not allow for the load to be spread across all the contacts (14) and causes a non-uniform load that is concentrated on the four corners where the fasteners (4) are located.

The uniformity of load distribution applied to the contacts (14) is important for the electrical function of each individual contact (14). In an effort to improve load distribution, some conventional devices use a spherical or cylindrical curvature within the clamping hardware to redistribute the load. For example, a curvature may be placed in the center of the bolster plate. This allows a portion of the load to be offset from the four corners to the center of the clamping hardware. Alternatively, a flat, extremely stiff bolster plate may be used to spread the load away from the four corners.

SUMMARY

In general, in one aspect the invention relates to an integrated circuit housing. The integrated circuit housing comprises a first clamping hardware, a second clamping hardware operatively connected to the first clamping hardware, and an integrated circuit stack comprising a top portion and a bottom portion, wherein the first clamping hardware contacts the top portion and the second clamping hardware contacts the bottom portion, and wherein a first shim is interposed between the bottom portion and the second clamping hardware.

In general, in one aspect the invention relates to a method for designing a shim. The method comprises obtaining a configuration profile of an integrated circuit housing, analyzing the integrated circuit housing the profile to obtain the configuration of the shim, and designing the shim using the configuration of the shim.

In general, in one aspect the invention relates to a method for designing a shim. The method comprises obtaining a pressure imprint of load distribution on a contact resulting from applying pressure to the contact, analyzing the pressure imprint of load distribution on the contact to obtain a configuration of the shim, and designing the shim using the configuration of the shim.

In general, in one aspect the invention relates to a method for creating load uniformity. The method comprises determining a first load distribution within a stack, designing a shim based on the first load distribution, placing the shim in the stack to create a second load distribution, wherein the second load distribution improves load balance.

Other aspects and advantages of the invention will be apparent from the following description and the appended claims.

DETAILED DESCRIPTION

Figure 1:
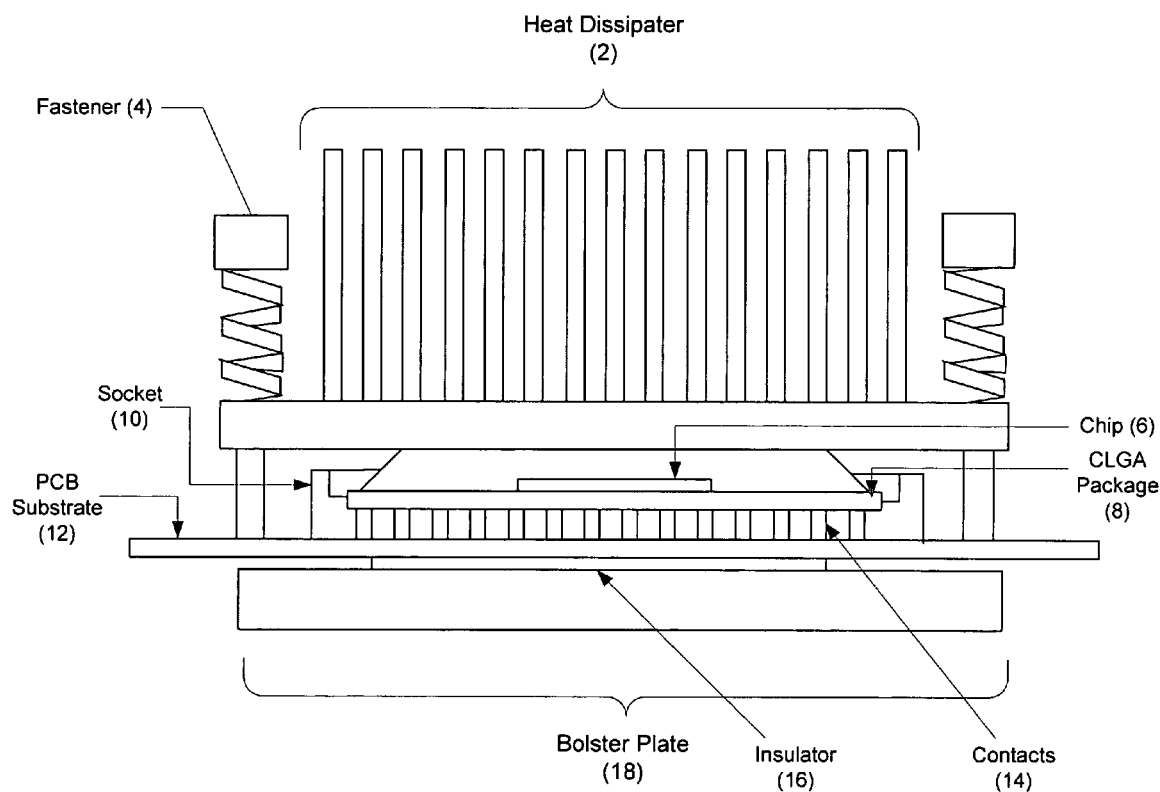
FIG. 1 illustrates a typical integrated circuit housing.

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 2:
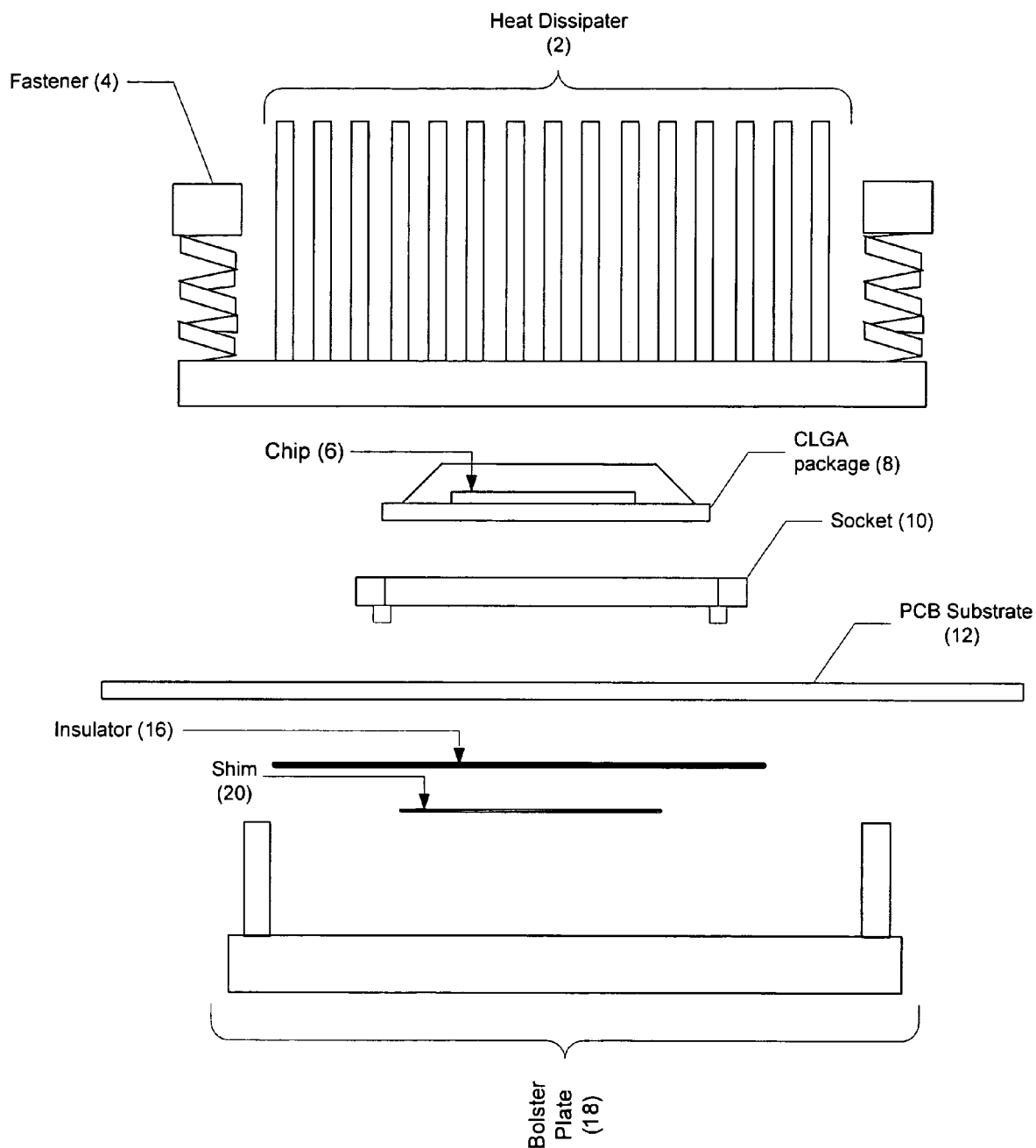
FIG. 2 illustrates an exploded view of an integrated circuit housing in accordance with an embodiment of the present invention.

FIG. 2 illustrates a blown-up view of the integrated circuit housing in one embodiment of the present invention. The integrated circuit housing typically includes a stack and surrounding clamping hardware. In the center of the figure, a chip (6) operates on top of a ceramic land grid array (CLGA) package (8). The CLGA package (8) contains small, shaped metal pads that connect to internal wires leading up to the chip (6). A socket (10) is an electrical interconnect that surrounds both the chip (6) and the CLGA package (8). The socket (10) allows the chip (6) to electrically interface with a printed circuit board (PCB) substrate (12) through the CLGA package (8). The PCB substrate (12) also contains metal pads (not shown) on the surface that correspond to the metal pads on the CLGA package (8) beneath the chip (6). Each individual connection that is made between the PCB substrate (12) and the CLGA package (8) components is called a contact (14). All of the aforementioned internal components surrounding the chip (6) may be collectively referred to as a stack.

Continuing with FIG. 2, the stack is typically affixed with clamping hardware. The clamping hardware characteristically surrounds the stack, and includes a heat dissipater (2) (e.g., a heat sink), a bolster plate (18), and as many as four fasteners (4). The heat dissipater (2) may be affixed to the bolster plate (118) via four fasteners (4) that fasten through the PCB substrate (one on each corner of the bolster plate). The bolster plate (18) is typically a rigid and stiff element. Between the bolster plate (18) and the backside of the PCB (12) is a thin insulator (16) made of plastic material, which is typically included for its electrical properties. Examples of plastic materials used as an insulator include polyester film (e.g., Mylar), polyamides, and polycarbonate film.

In normal use, the clamping hardware may cause bending of the IC housing in various places when the hardware is tightened. This bending may be seen, for example, on the PCB substrate (12). This bending, along with other factors, results in non-uniform load distribution in the contacts. In one embodiment of the invention, a shim (20) is placed between the insulator (16) and the bolster plate (18) to even the load distribution on the individual contacts between the CLGA package (8) and the PCB substrate (12). One skilled in the art will appreciate that the shim may also be a load leveler, a contoured profile, a profiled shim, a load leveling shim, a contoured shim, etc.

Figure 3:
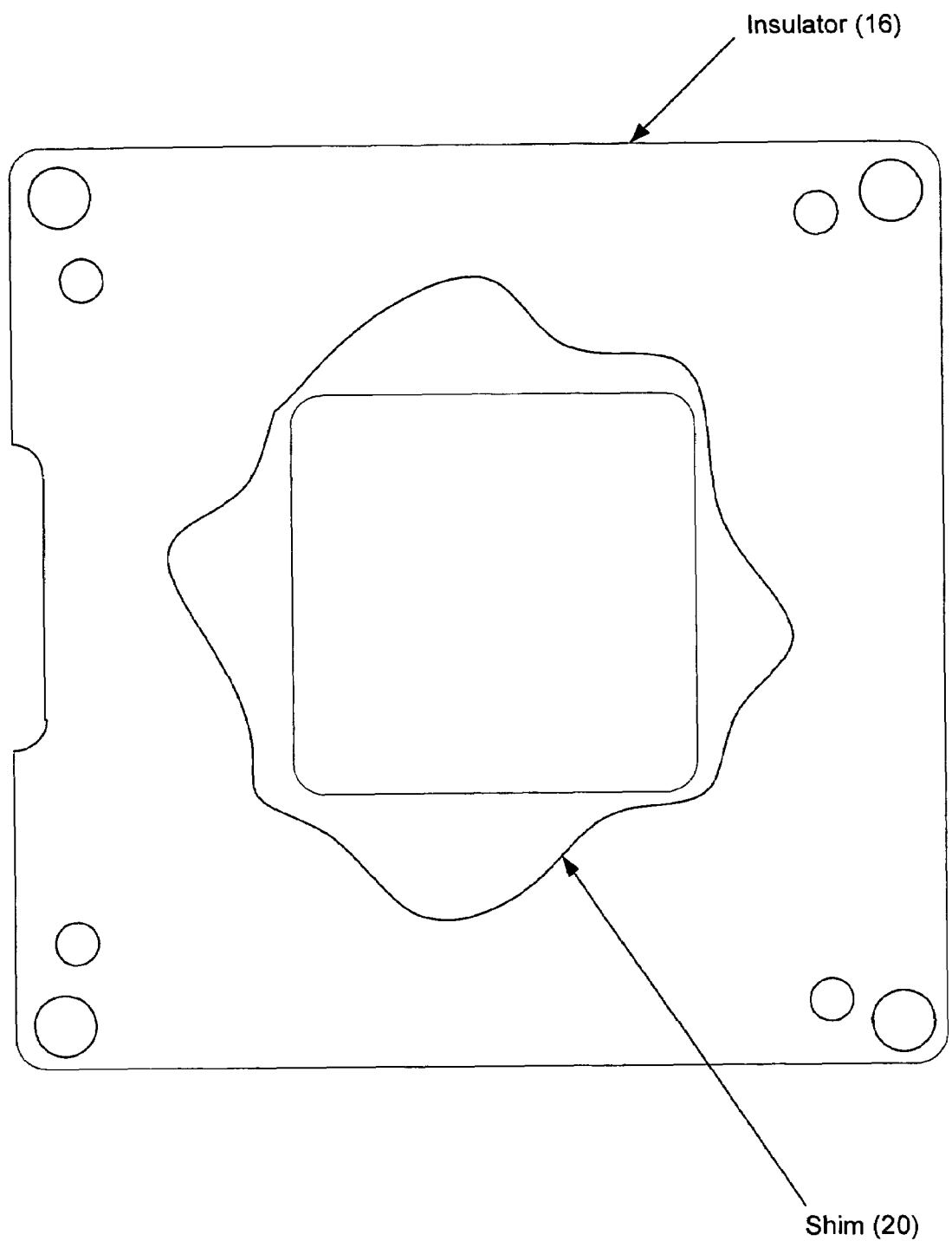
FIG. 3 illustrates a typical insulator in accordance with an embodiment of the present invention.

FIG. 3 illustrates a top view of the shim (20) in accordance with one embodiment of the invention. As noted above, the shim (20) may be placed between the PCB substrate (12) and the bolster plate (18), either above or below the insulator (16). In one embodiment of the invention, the shim (20) is affixed to the insulator (16) such that the shim (20) is located between the bolster plate (18) and the bottom side of the insulator (16). The insulator (16) may include a square shaped cutout in the center to clear space for components on the backside of the PCB substrate (not shown). The shim (20) is placed along the edge of the center cutout of the insulator (16). One skilled in the art will appreciate that an insulator may not have a center cutout. In this case, a shim is affixed to and covers the entire center portion of an insulator. Additionally, one skilled in the art will appreciate that an insulator may have several smaller holes located in the center region. In this configuration, the shim would also contain corresponding holes.

A number of materials may be used to produce the shim (20). For example, the shim (20) may be produced using a polyester film (e.g., Mylar), a polyamide, a polycarbonate film, or any other material that includes the thermal and electrical properties required to be used in an electrical device. In addition, the materials from which the shim (20) is made, should allow the shim (20) to remain thin and retain a high modulus.

The shim (20) is affixed to the insulator (16) using high temperature, electronic grade acrylic adhesive (not shown). In one embodiment of the invention, the acrylic adhesive may add functionality to the shim (20) by providing additional absorption of high load areas (high spots). The acrylic adhesive may be single-sided adhesive or double-sided adhesive. Additionally, the acrylic adhesive may be pre-manufactured or applied manually. The acrylic adhesive is typically formulated to withstand high ranges of temperature. One skilled in the art will appreciate that there may be several other adhesive configurations to affix the shim (20) to the insulator (16).

Figure 4:
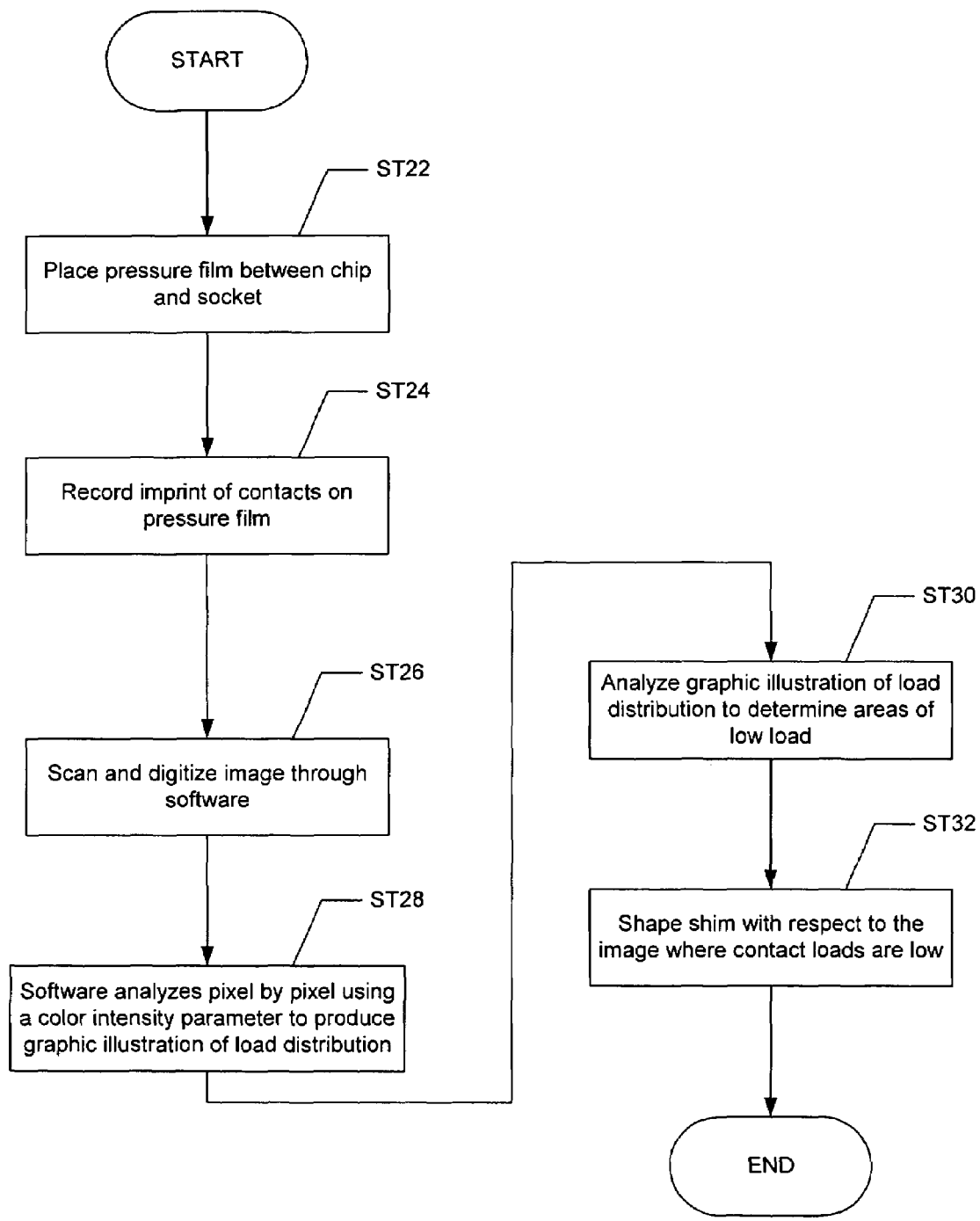
FIG. 4 illustrates a flow chart describing a process in accordance with an embodiment of the present invention.

FIG. 4 shows a flow chart for a method of determining the shape of the shim for a given configuration in accordance with one embodiment of the present invention. Initially, a pressure film is placed between the chip and the socket (Step 22). One skilled in the art will appreciate that the pressure film may also be placed between the CLGA package and the PCB substrate. Subsequently, an imprint is obtained by applying pressure to the contacts via tightening of the clamping hardware (Step 24). The imprint is then scanned and digitized using software to produce a digitized image (Step 26). The digitized image may then be analyzed pixel by pixel via software. For example, analysis may be done using a color intensity parameter or an equivalent method to distinguish disproportionate areas of load distribution. A graphic illustration of load distribution is subsequently produced with the color intensity of the graphic illustration being directly proportional to the load distribution on the contacts (Step 28). In other words, areas of low color intensity signify low load distribution among the contacts, and vice versa.

Given that the pressure imprint obtained is digitized by software, the quality of the imprint is fairly important. In one embodiment of the invention, the imprint quality is improved by using additional spacers (e.g., one or two washers) to increase the average load applied to the contacts. The spacers push on fasteners in the clamping hardware to obtain a more defined imprint while not impacting the uniformity of the load distribution.

Figure 5A:
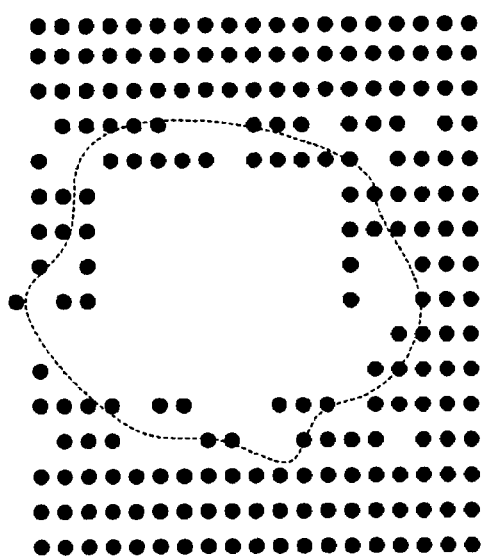
FIGS. 5A and 5B illustrate patterns in accordance with an embodiment of the present invention.
Figure 5B:
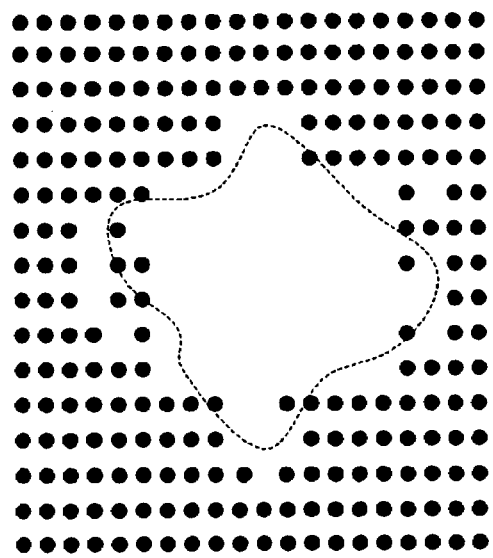

For example, FIG. 5A shows a graphic illustration in accordance with one embodiment of the present invention. This illustration is obtained with one spacer to increase the average load via the clamping hardware. The regions with no imprint signify low load areas on the contacts. Using one spacer, the illustration in FIG. 5A shows a general view of regions with inadequate load on the contacts. FIG. 5B also shows a graphic illustration in accordance with one embodiment of the present invention. Again, the regions of no imprint suggest areas of low load distribution on the contacts. In this illustration two spacers were used to increase the average load applied to the contacts. With the increased number of spacers, FIG. 5B shows a more defined view of where contact pressures are inadequate. In other words, the extent of the pattern obtained may be enhanced with an increased number of spacers.

Referring back to the flow chart of FIG. 4, the graphic illustration produced by software may then be analyzed (as described above) to determine areas of inadequate load on contacts (Step 30). The shape of the shim may be determined with respect to the graphic illustration by drawing an outline which encompasses areas in which contact load distribution is low (this shape is shown in FIGS. 5A and 5B as a dotted line) (Step 32).

Figure 6:
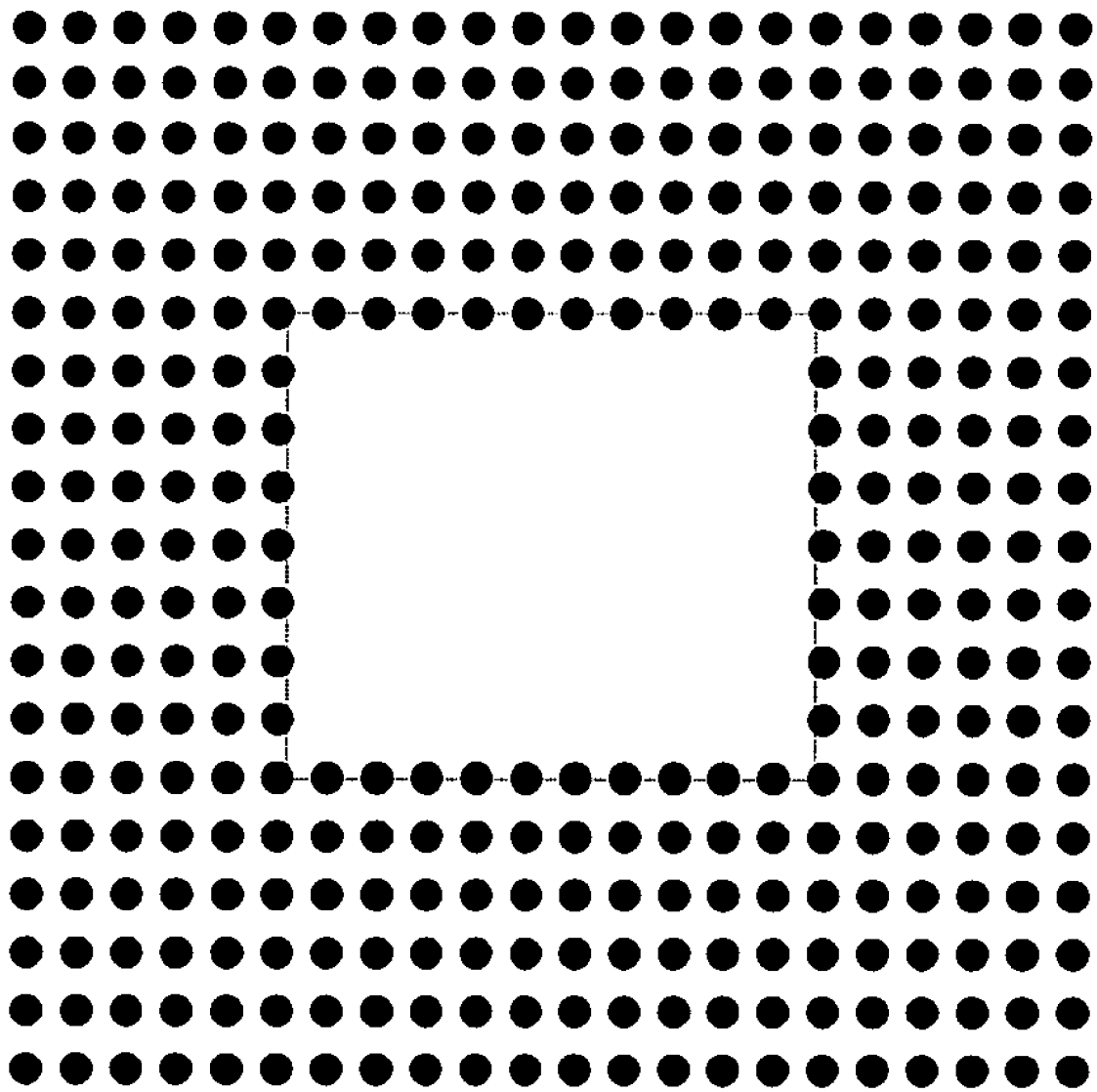
FIG. 6 illustrates a pattern in accordance with an embodiment of the present invention.

In one embodiment of the invention, the outline obtained after analysis of the graphic illustration represents the shape of the shim. FIG. 6 shows, in accordance with one embodiment of the present invention, the graphic illustration produced when pressure is applied to the contacts using two spacers with the shim (designed using the method described above) attached to the insulator. The load is evenly distributed among each individual contact (i.e., areas of no recorded imprint are nonexistent).

In one embodiment of the invention, the shape of the shim may be determined by viewing the pressure film directly to conclude areas of inadequate load on the contacts. As discussed above, the pressure applied to the contacts creates an imprint on the pressure film which may be viewed without the use of software analysis to establish a load distribution on the individual contacts. Alternatively, the pressure film may be dyed and then viewed in order to distinguish areas of low load more clearly.

In an embodiment of the invention, the shape of the shim may be determined using modeling techniques. Analytical modeling and empirical modeling are two types of modeling that may be used. Analytical modeling involves the use of interpolation to determine the shape of the shim. For example, the shape of the shim for two particular configuration profiles (particular clamping hardware and stack components) may be obtained through the aforementioned methods. From there, if a particular configuration of an IC housing slightly differs from both of the predetermined configuration profiles, one may interpolate the shape of the shim for the new integrated circuit housing configuration from the shim shape of the previous two configuration profiles.

Empirical modeling includes collecting data to interpret for future configuration profiles. Through trial and error, a configuration profile may be obtained to determine the shape of the shim. In one embodiment of the present invention, the configuration profile may be based on the type of chip in the integrated circuit, the type of heat dissipater, or the type of bolster plate. One skilled in the art will appreciate that the configuration profile may include other elements and may not be limited to the aforementioned components. Once this information is obtained, the resulting shape of the shim is entered into a repository (e.g., a database) along with the particular configuration that was used. An empirical model may use this repository to retrieve a particular configuration and shape the shim based on the information contained in the repository or by a user-defined query.

The shim may be constructed by molding, cutting, or stacking sheets of material. The sheets of material may be held together with the same acrylic adhesive used to attach the shim to the insulator. The shim may also be constructed by cutting the center of the shim in a specific pattern and then folding back the flaps so that they form raised areas that shape the load in order to reduce the number of parts. Using this technique, the number of materials is reduced because layers of plastic material are no longer needed to form raised areas. A laser or other high precision device may also be used to remove material from the shim in a particular pattern.

Embodiments of the present invention may include one or more of the following advantages. The properties of the material from which the shim is produced should permit the shim to change shape and geometry without affecting the load distribution greatly. In addition, the shim may be dynamically customized based upon the measure of flatness of the IC housing. Further, the shim is easy to add to a particular IC housing structure. For example, rather than adding a new bolster plate design to an existing structure, load distribution may be corrected by simply adding a shim to the existing structure (i.e. retrofit the existing structure to include a shim).

Additionally, the overall cost to produce the shim is very low. Once the shim is constructed for a particular integrated circuit housing, additional processing for each circuit board with the same processor and similar clamping hardware is not required. Thus, the only significant material cost for producing the shim is the type of plastic film, which is very low due to the abundance of these sorts of plastic materials. Those skilled in the art will appreciate that the present invention may include other advantages and features.

While the invention has been described with respect to a limited number of embodiments and advantages, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for creating load uniformity comprising:
   determining a first load distribution within a stack;
   obtaining a pressure imprint of the first load distribution;
   analyzing the pressure imprint of the first load distribution to obtain a configuration of the shim;
   designing a shim based on the first load distribution using the configuration of the shim; and
   placing the shim in the stack, in between a printed circuit board and an insulator, to create a second load distribution, wherein the second load distribution improves load balance,
   wherein the first and second load distributions represent a distribution across a plurality of contacts of the load imparted on the stack from a device that places pressure on the stack.

2. The method of claim 1, wherein analyzing the integrated circuit housing the profile comprises using the profile as input into at least one selected from the group consisting of an analytical model and an empirical model.

3. The method of claim 2, wherein the configuration profile comprises at least one parameter having an effect on load distribution of a contact.

4. The method of claim 2, wherein the configuration profile is stored in a data repository.

5. The method of claim 1, further comprising:
   placing a pressure film between a ceramic land grid array package and the contact; and
   applying pressure to the contact.

6. The method of claim 1, further comprising:
   viewing the pressure imprint.

7. The method of claim 1, wherein analyzing the pressure imprint comprises:
   digitizing the pressure imprint to produce a digitized image;
   analyzing the digitized image to produce a graphic illustration of load distribution using a color intensity scheme;
   analyzing the graphic illustration of load distribution to determine a region of low load; and
   defining the configuration of the shim using the region of low load.

* * * * *

UNITED STATES PATENT AND TRADEMARK OFFICE
CERTIFICATE OF CORRECTION

PATENT NO. : 7,323,363 B1  Page 1 of 1
APPLICATION NO. : 10/770192
DATED : January 29, 2008
INVENTOR(S) : Donald A. Kearns et al.

It is certified that error appears in the above-identified patent and that said Letters Patent is hereby corrected as shown below:

In Claim 2, Column 6, Line 38, insert the word --using-- after "housing".

Signed and Sealed this

Sixth Day of May, 2008

JON W. DUDAS
*Director of the United States Patent and Trademark Office*